US010830856B2

(12) United States Patent
Boernert et al.

(10) Patent No.: US 10,830,856 B2
(45) Date of Patent: Nov. 10, 2020

(54) GRADIENT IMPULSE RESPONSE FUNCTION MAPPING

(71) Applicant: KONINKLIJKE PHILIPS N.V., Eindhoven (NL)

(72) Inventors: Peter Boernert, Hamburg (DE); Miha Fuderer, Eindhoven (NL); Kay Nehrke, Ammersbek (DE); Klaas Pruessmann, Zurich (CH); Jurgen Edwin Rahmer, Hamburg (DE); Bertram Wilm, Zurich (CH); Christian Stehning, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/340,492

(22) PCT Filed: Sep. 28, 2017

(86) PCT No.: PCT/EP2017/074598
§ 371 (c)(1),
(2) Date: Apr. 9, 2019

(87) PCT Pub. No.: WO2018/069050
PCT Pub. Date: Apr. 19, 2018

(65) Prior Publication Data

US 2019/0250237 A1 Aug. 15, 2019

(30) Foreign Application Priority Data

Oct. 10, 2016 (EP) .................................... 16193056

(51) Int. Cl.
*G01V 3/00* (2006.01)
*G01R 33/565* (2006.01)
(Continued)

(52) U.S. Cl.
CPC ... *G01R 33/56572* (2013.01); *G01R 33/3852* (2013.01); *G01R 33/5611* (2013.01); *G01R 33/24* (2013.01)

(58) Field of Classification Search
USPC ........................................................ 324/309
See application file for complete search history.

(56) References Cited

U.S. PATENT DOCUMENTS 5,451,877 A 9/1995 Weissenberger
7,208,951 B2 4/2007 Pruessmann et al.
(Continued)

OTHER PUBLICATIONS

Vannesjo et al "Gradient System Characterization by Impulse Response Measurments With A Dynamic Field Camera" Magn. Reson Med. 69 p. 583-593 (2013).
(Continued)

*Primary Examiner* — Rodney E Fuller

(57) ABSTRACT

A magnetic resonance imaging system includes a gradient system and a processor for controlling the magnetic resonance imaging system. Execution of machine executable instructions causes the magnetic resonance imaging system to: acquire by coil elements first magnetic resonance data simultaneously from a group of passive local probes, wherein the first group of passive local probes includes a plurality of passive local probes located spaced apart from each other; disentangle contributions to the first magnetic resonance data from the individual local probes, calculate for the magnetic resonance imaging system a gradient impulse response function of the gradient system using the first magnetic resonance data from the local probes; and determine correction factors using the gradient impulse response function

17 Claims, 10 Drawing Sheets

(51) Int. Cl.

| | |
|---|---|
| ***G01R 33/385*** | (2006.01) |
| ***G01R 33/561*** | (2006.01) |
| *G01R 33/24* | (2006.01) |

(56) References Cited

U.S. PATENT DOCUMENTS

| | | | | |
|---|---|---|---|---|
| 9,791,526 | B2 | 10/2017 | Barmet et al. | |
| 10,379,190 | B2 * | 8/2019 | Wilm | G01R 33/58 |
| 2010/0102819 | A1 | 4/2010 | Zaitsev et al. | |
| 2010/0164495 | A1 | 7/2010 | Takizawa et al. | |
| 2013/0088230 | A1 | 4/2013 | Eggers | |
| 2014/0125333 | A1 | 5/2014 | Hanada et al. | |
| 2015/0276901 | A1 | 10/2015 | Cowan et al. | |
| 2016/0011284 | A1 | 1/2016 | Popescu | |
| 2019/0162807 | A1 * | 5/2019 | Zahneisen | G01R 33/56518 |
| 2019/0378270 | A1 * | 12/2019 | Ida | A61B 5/055 |

OTHER PUBLICATIONS

De Zanche et al "NMR Probes for Measuring Magnetic Fields and Field Dynamics in Magnetic Resonance Imaging Systems" Magn. Reson. Med. 60 p. 176-186 (2008).

Pruessmann et al "Sense: Sensitivity Encoding for Fast MRI" Magnetic Reson. In Med. 42 p. 952-962 (1999).

Bernstein "Handbook of MRI Pulse Sequences" p. 527-531 (2004).

Vannesjo et al "Image Reconstruction Using A Gradient Impuse Response Model for Trajectory Prediction" Magnetic Res. In Med. vol. 76, No. 1 Jul. 2015 p. 45-58.

Liu et al "Accurate Measurement of Magnetic Resonance Imaging Gradient Charateristics" Materials, vol. 7, No. 1 p. 1-15 Dec. 19,2013.

Vannesjo et al "A Method for Characterizing the Magnetic Field Response of A Graident System" Proceedings of The ISMRM Joint Annual Meeting, May 1, 2010.

Duyn et al. "Simple Correction Method for K-Space Trajectory Deviations in MRI." JMR 132 (1998): 150-53.

Brodsky et al. "Rapid Measurement and Correction of Phase Errors from B 0 Eddy Currents: Impact on Image Quality for Non-Cartesian Imaging." MRM 69 (2013): 509-15.

Ryan K. Robison et al. "Fast, Simple Gradient Delay Estimation for Spiral MRI" MRM 63:1683-1690 (2010).

Addy NO, Wu HH, Nishimura DG. Simple method for MR gradient system characterization and k-space trajectory estimation. Magn Reson Med. Jul. 2012;68(1):120-9.

Bottomley, Paul A. "Spatial Localization in NMR Spectroscopy in Vivo." Annals of the New York Academy of Sciences 508, No. 1 (Nov. 1, 1987): 333-48.

Lin FH, Wald LL, Ahlfors SP, Hämäläinen MS, Kwong KK, Belliveau JW. Dynamic magnetic resonance inverse Imaging of human brain function. Magn Reson Med. Oct. 2006;56(4):787-802.

Adrienne E. Campbell-Washburn et al; "Real-Time Distortion Correction of Spiral and Echo Planar Images Using the Gradient System Impulse Response Function", MRM, vol. 75, issue 6 p. 2278-2285 (Jun. 2016).

S. Johanna Vannesjo et al.,"Field Camera Measurements of Gradient and Shim Impulse Responses Using Frequency Sweeps" MRM, vol. 72 p. 570-583 (2014).

Dietrich BE, Brunner DO, Wilm BJ, Barmet C, Pruessmann KP. Continuous Magnetic Field Monitoring Using Rapid Re-Excitation of NMR Probe Sets. IEEE Trans Med Imaging. Jun. 2016;35(6):1452-62.

* cited by examiner

GRADIENT IMPULSE RESPONSE FUNCTION MAPPING

CROSS REFERENCE TO RELATED APPLICATIONS

This application is a U.S. national phase application of International Application No. PCT/EP2017/074598 filed on Sep. 28, 2017, which claims the benefit of EP Application Ser. No. 16193056.5 filed on Oct. 10, 2016 and is incorporated herein by reference.

FIELD OF THE INVENTION

The invention relates to magnetic resonance imaging, in particular to determining a gradient impulse response function of a magnetic resonance imaging system.

BACKGROUND OF THE INVENTION

Magnetic Resonance Imaging (MRI) scanners, also referred to as magnetic resonance tomographs, use a large static magnetic field to align the nuclear spins of atoms of as part of the procedure for producing images within the body of a patient. This large static magnetic field is referred to as the B0 field or the main magnetic field.

One method of spatially encoding is to add one or more gradient fields to the B0 field using one or more magnetic field gradient coils provided by a gradient system. Typically, there are three magnetic gradient coils which are used to generate three different gradient magnetic fields in three different orthogonal directions of space.

During an MRI scan, Radio Frequency (RF) pulses generated by one or more transmitter coils cause a so called B1 field. The applied gradient fields and the B1 field do cause perturbations to the effective local magnetic field resulting in an excitation of at least some of the nuclear spins. The excited nuclear spins emit RF signals that are detected by one or more receiver coils. Magnetic resonance data may be acquired separately by the individual receiver coils.

Such a MRI system represents a complex magnetic resonance signal generation and data acquisition system, which, in particular when driven to its limits, may not perform ideal. For example, the generated magnetic fields may comprise unintended deformations affecting the magnetic resonance data acquired. Such effects may for example be important for those components of the MRI system that are involved in the spatial encoding process like a gradient system generating magnetic field gradients. The gradient system may slightly change its behavior during heavy duty scanning, especially when the gradient coil or involved driving components like an amplifier heat up. Such changes in the behavior of the gradient system may result in changes of the generated gradient fields providing the spatial encoding.

A MRI system may be characterized by a number of transfer functions. Among many others, the gradient impulse response function (GIRF) is one of the most essential ones, because it is related to spatial encoding and image quality. The GIRF reflects the linear, time-invariant (LTI) physical properties of the gradient system. It describes how an ideal gradient waveform, which the gradient system is supposed to generate, looks like in reality or is seen by a spin system which is excited by the respective magnetic field gradient.

As a transfer function, the GIRF may provide an efficient way to characterize the properties of the gradient system, which may be subject to unintended changes e.g. in case of high duty cycle induced gradient coil heating.

Vannesjo S. J., Haeberlin M., Kasper L., Pavan M., Wilm B. J., Barmet C., and Pruessmann K. P. in "Gradient System Characterization by Impulse Response Measurements with a Dynamic Field Camera. Magn Reson Med., 69: 583-593 (2013)" describe a method to determine the GIRF measuring the gradient magnetic field using a field camera. A field camera in its simplest form is a receive array consisting out of a number micro-coils containing a small MR vessel placed at different known spatial locations allowing to sample the signal while a certain gradient GIRF encoding waveform is played out. As described by De Zanche, N., Barmet, C., Nordmeyer-Massner, J. A., and Pruessmann, K. P. in "NMR probes for measuring magnetic fields and field dynamics in Magnetic resonance imaging systems. Magn. Reson. Med., 60: 176-186 (2008)" such a field camera inter alia comprises a closely coupled detector coil provided by a solenoidal micro-coil. The detector coil may be connected to a separate read out line comprising a pre-amplifier, a balanced shielded transmission line and an impedance matching network. Thus, a field camera makes additional hardware necessary, in particular additional data acquisition hardware, which makes the MRI system more complex and may add to system costs.

SUMMARY OF THE INVENTION

The invention provides for a magnetic resonance imaging system, a computer program product and a method in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit', 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising 'a processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A ‘display’ or ‘display device’ as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical image data. A Magnetic Resonance Imaging (MRI) image is defined herein as being the reconstructed two-dimensional or three-dimensional visualization of structural and in particular anatomic data contained within the magnetic resonance imaging data. This visualization can be performed using a computer.

As used herein a parallel imaging method encompasses imaging methods using a plurality of receiving coils for magnetic resonance imaging. Spatial information obtained from arrays of RF coils sampling data in parallel may be used to perform some portion of spatial encoding usually done by gradient fields, typically the phase encoding gradient. Thus, MRI acquisition times may be speeded up without a need for faster switching gradients or for additional RF power deposited. Furthermore, parallel imaging may be used to disentangle magnetic resonance signals originating from different spatial locations. Examples of parallel imaging methods are k-space simultaneous acquisition of spatial harmonics (SMASH), generalized autocalibrating partially parallel acquisitions (GRAPPA), and image domain sensitivity encoding (SENSE).

The SENSE reconstruction technique was introduced by the journal article Pruessmann et al., “SENSE: sensitivity encoding for fast MRI,” Magnetic Resonance in Medicine, 42:952-962 (1999). The terminology to describe the SENSE reconstruction is well known and has been the subject of many review articles and is present in standard texts on Magnetic Resonance Imaging. For example, “Handbook of MRI Pulse Sequences” by Bernstein et. al., published by Elsevier Academic Press in 2004 contains a review of the SENSE reconstruction technique on pages 527 to 531.

In one aspect the invention provides a magnetic resonance imaging system comprising a magnetic resonance imaging magnet for generating a main magnetic field for orientating the magnetic spins of nuclei of a subject located within an imaging volume and at least one magnetic field gradient system for generating a gradient magnetic field for spatial encoding of a magnetic resonance signal of spins of nuclei within the imaging volume. The gradient system comprises a gradient amplifier and a gradient coil.

Magnetic resonance imaging requires gradient-coils to invoke position-dependent fields while acquiring information from the subject. In general, the gradient-system may be designed to create a field that varies perfectly linearly in space and that exactly follows the demand from a processor controlling the magnetic resonance imaging system. However, gradient fields generated by the gradient-system may not be perfect. Most notably, when switching gradient demand, all conducting structures in the MR system may cause eddy-currents. These eddy-currents may a cause transient field-settling behavior decaying with a variety of time constants. Under the assumption that this behavior is linear, it can be expressed in the form of the gradient impulse response function.

With good knowledge of the respective behavior, the demand may be pre-corrected or, alternatively, deviations of this behavior from a predefined ideal behavior may be taken into account when reconstructing magnetic resonance images. An insufficient knowledge of the respective behavior may lead to an inferior image quality.

The magnetic resonance imaging system may comprise three gradient coils which are used to generate three different gradient magnetic fields in three different orthogonal directions which are superposed. Thus, when referring to a gradient magnetic field in the following, the respective gradient magnetic field may actually be a superposition of two or more gradient magnetic fields generated by two or more gradient coils. The magnetic resonance imaging system further comprises a radio-frequency system comprising a coil array with a plurality of coil elements configured for acquiring magnetic resonance data using parallel imaging. The multiple coil elements may be configured for acquiring magnetic resonance data separately. In other words, the multiple coil elements may be configured such that they are configured for independently transmitting and/or receiving radio signals.

The gradient system may further comprise a driver unit that is configured to apply a pre-emphasis to the demand gradient waveform.

The magnetic resonance imaging system further comprises a memory storing machine executable instructions and pulse sequence commands. The pulse sequence commands are configured for controlling the magnetic resonance imaging system to acquire the magnetic resonance data according to a parallel imaging protocol.

The pulse sequence commands may be in the form of instructions which are directly executable by portions of the magnetic resonance imaging system or they may be in the form of data such as a timing sequence which may be compiled or converted into such instructions for directly controlling components of the magnetic resonance imaging system.

The magnetic resonance imaging system further comprises a processor for controlling the magnetic resonance imaging system. Execution of the machine executable instructions causes the processor to control the magnetic resonance imaging system to acquire by the coil elements first magnetic resonance data simultaneously from a first group of passive local probes using a first set of the pulse sequence commands. A passive probe does not comprise any data acquisition hardware on its own, like e.g. a detector coil, for acquiring magnetic resonance data from the probe. According to present disclosure magnetic resonance data from the passive local probes is rather acquired using the coil array which is also used to acquire magnetic resonance data from a subject to be scanned in order to generate a magnetic resonance image. Therefore, the passive local probes do not comprise any additional magnetic resonance data acquisition hardware. The first group of passive local probes comprises a plurality of passive local probes located spaced apart from each other. The magnetic resonance imaging system is further controlled to disentangle contributions to the first magnetic resonance data from the individual local probes using the parallel imaging protocol and to calculate for the magnetic resonance imaging system a gradient impulse response function of the gradient system using the first magnetic resonance data from the local probes. The gradient impulse response function may be calculated using a series expansion. In other words, the gradient impulse response function is calculated with a precision up to contributions of a particular spatial order. Thus, the gradient impulse response function may be expanded into a suitable set of spatial basis functions like e.g. spherical harmonics. The magnetic resonance imaging system is further controlled to determine a correction for compensating a deviation of the behavior of the gradient system from a predefined behavior using the gradient impulse response function.

The magnetic resonance imaging system is further controlled to apply the correction for generating magnetic resonance images of a subject. The GIRF maps the physical properties of the entire gradient chain, i.e. the entire hardware contributing to the actual form of the magnetic field gradient. The entire gradient chain may comprise gradient system taking into account contributions resulting for example from waveform generation, pre-emphasizing, gradient amplification, filtering, as well as contributions resulting from cable properties, self and system eddy-currents, etc. From the GIRF potential corrections may be derived to be considered in the MR reconstruction helping to obtain an optimized MR image quality. The GIRF may further be used to drive the magnetic resonance imaging system appropriately. Such corrections may be derived by comparing the values intended for the GIRF with the values actually measured and determining corrected setting for the hardware and/or correction factors to be taken into account, when reconstructing magnetic resonance images, in order to compensate deviations from the intended values.

Generating the magnetic resonance images comprises acquiring second magnetic resonance data from the subject with a second set of the pulse sequence commands by the coil elements and reconstructing the magnetic resonance images of the subject using the second magnetic resonance data.

The machine executable instructions may comprise pulse sequence data. Pulse sequence data as used herein encompasses data that may be used to control the magnetic resonance imaging system to acquire magnetic resonance data according to a particular magnetic resonance imaging protocol. The pulse sequence data may for instance be in the form of commands which may be executed or it may be in the form of a timing diagram or timing information which may be converted by a program into commands for controlling the magnetic resonance imaging system.

Embodiments may have the beneficial effect to provide a cost-efficient magnetic resonance imaging system that may be able to measure, in a short measurement time, the full frequency spectrum of the GIRF, including cross-terms.

The GIRF is measured on the basis of the simultaneous responses from a plurality of local probes. Spatially selective excitation and signal encoding based on parallel imaging may be employed for simultaneous excitations of several of the probes and to disentangle the individual signal contributions from these several probes. Thereby, MR signals from multiple simultaneously excited passive local probes may be generated and read out. The passive local probes may for example be provided in form of a plurality of physical phantom probes or in form of plurality of virtual δ-probes excited in a common physical probe, e.g. in a phantom or in-vivo in an object to be scanned. That is, the virtual δ-probe is formed by excitation of a volume that has a small extension transverse (e.g. a thin slice) to the gradient direction for which the GIRF is to be evaluated or an excitation having a spatial distribution transverse to the gradient direction for which the GIRF is to be evaluated. A physical δ-probe may simply be a very small volume of matter that is radio frequency excited, or a larger volume of matter from the relaxation magnetic resonance signals are acquired with a (micro) receive coil with a very small extension of its sensitive volume. Physical phantom probes may be excited simultaneously by the RF system of the magnetic resonance imaging system by applying a hard RF pulse. A hard pulse is a pulse shaped like a RECT function in the time domain. Hard pulses may be used when no spatial or spectral selection is required and may be convenient because the pulse length can be very short. On the basis of the response signal from the probes resulting from the hard RF pulse the GIRF may be determined. The MR signals from the multiple physical phantom probes may be unfolded for spatial separation, thereby supporting the estimation of the GIRFs from these multiple source data.

Thus, a simple and efficient field monitoring system to determine the gradient impulse response function (GIRF) of a magnetic resonance system is provided enabling an efficient determination of the GIRF, in particular reducing the measurement time required to determine the GIRF. A GIRF measurement for multiple gradient direction and up to higher than linear spatial orders may be achieved. Thus, embodiments may replace the field camera approach without a need for additional hardware like integrated detector coils, to measure the GIRF. This may be achieved by using the existing parallel receiving hardware of the magnetic resonance imaging system, especially in combination with simultaneous multi-band excitation to facilitate efficient GIRF mapping also for high spatial orders in short total scanning times allowing for close to real-time GIRF mapping. Parallel imaging like e.g. SENSE, GRAPPA, or SMASH may be employed for signal unfolding, wherein advantage may be taken from the multiple coil elements of the radio frequency system which are used as receiving coils.

According to an example, the first group of passive local probes comprises at least three passive local probes and wherein the gradient impulse response function is calculated at least up to second order contributions. Using three or more passive local probes may allow mapping of more than one gradient field at a time, when a superposition of a plurality of gradients is generated by the magnetic resonance imaging system. Furthermore, it may they allow to capture cross-effects, e.g. x-components of the gradient field that are invoked by switching the y-gradient channel.

According to an example, wherein the passive local probes comprise a plurality of virtual δ-probes excited spaced apart from each other within a common physical probe arranged within the magnetic resonance imaging system. This may be beneficial, because at most a common physical probe is required as an additional element to be incorporated into the magnetic resonance imaging system to efficiently determine the GIRF. A δ-probe is a probe with a restricted extension in at least one spatial direction. The restricted extension is chosen such that influences of the respective extension are negligible for the desired accuracy, when determining the GIRF. For example, the restricted extension may be of the order of 5 mm or less, e.g. 2 mm. A δ-probe may for example be provided in form of a slice through a small physical phantom probe. In order to enable an excitation of a plurality of δ-probes, the physical phantom may have an elongated shape.

According to an example, the physical probe is a phantom probe. This may be beneficial, because the size and position of the phantom probe may be optimized for exciting the virtual δ-probe and/or for acquiring data characterizing the GIRF.

According to an example, the physical probe is the subject of which the magnetic resonance images are to be generated. This may be beneficial, because no additional element may have to be incorporated into the magnetic resonance imaging system in order to efficiently determine the GIRF.

According to an example, the passive local probes comprise a plurality of physical phantom probes which are located spaced apart from each other within the magnetic resonance imaging system. This may be beneficial, because a spatially non-selective pulse sequence, e.g. a hard pulse, may be used to excite all the passive local probes simultaneously.

According to an example, the passive phantom probes have a spherical shape and are arranged at the corners of a regular polyhedron. This may be beneficial, because it may enable a precise measurement of the GIRF, wherein the symmetrical form and arrangement of the passive phantom probes reduces the inhomogeneity of the magnetic resonance signals received from the passive phantom probes. According to examples, the magnetic resonance imaging system may be provided with a support body, in particular with a homogeneous support body, in which the passive phantom probes are arranged. The support body may be magnetically inactive and have magnetic susceptibility that is equal to that of the passive phantom probes. The passive phantom probes may contain a magnetic resonant compound, e.g. doped water. According to examples, the homogeneous support body may be configured to fit within the receiver coil array.

According to an example, the first set of pulse sequence commands is configured for a spatially non-selective excitation of the passive local probes and signal encoding of the resulting first magnetic resonance data based on parallel imaging. This may be beneficial, because a spatial separation of the passive local probes may be provided the separation between physical phantom probe enabling to use a simple pulse sequence for exciting the physical phantom probes.

According to an example, the first set of pulse sequence commands is configured for a spatially selective excitation of the passive local probes and signal encoding of the resulting first magnetic resonance data based on parallel imaging. This may be beneficial, because a spatial separation of the passive local probes may be controlled by the pulse sequence not requiring any hardware modifications or supplements.

According to an example, the spatially selective excitation of the passive local probes comprises applying multi-dimensional or multi-band excitation pulses. Further, highly 2D or 3D selective RF pulses in form of multi-dimensional multi-band RF pulses, may allow to locally exciting virtual δ-probes in order to gain spatially better resolved GIRF information. In addition, these local excitations could be played out in parallel using the multi-band approach and the received signal could be spatially separated into its components from the individual δ-probes using e.g. SENSE, GRAPPA, or SMASH based on receiving coil sensitivity information. A further example may use a spatial selection schemes known from localized spectroscopy pulse sequence like e.g. PRESS or STEAM.

According to an example, the acquisition of the first magnetic resonance data comprises measuring a first set of magnetic resonance data from the passive local probes with the gradient field being applied to the passive local probes and a second set of magnetic resonance data from the passive local probes without applying the gradient field to the passive local probes, wherein off-resonance contributions are subtracted from the first magnetic resonance data, wherein the subtracting comprises subtracting the second set of magnetic resonance data from the first magnetic resonance data. This may be beneficial, because in this way, it may be possible to map a single gradient GIRF by two measurements, i.e. a first one with GIRF challenge and a second one without GIRF challenge. These two measurements may be performed fast enough for allowing real-time applications. Repeating the measurement without the gradient to be characterized in place may allow subtracting the off-resonance bias before further signal evaluation.

According to an example, the correction is applied to the generation of the magnetic fields when acquiring the second magnetic resonance data and/or to the reconstruction of the magnetic resonance images using the second magnetic resonance data. This may be beneficial, because deformations of the magnetic field gradient due to imperfects of the hardware used for generating the gradient may be efficiently compensated. The respective deformation may be balanced by adjusting the setup for generating the respective gradient. For example, zeroth order deformations may be addressed by changing the demodulation frequency or adding some extra field components to the homogenous B0-field using dedicated B0-compensation coils in the magnet. The linear components of the deformation may e.g. be corrected using appropriate gradient pre-emphasis or gradient delays. Deformations of the magnetic field gradient may also be taken into account by using the correction in the image reconstruction. In particular higher order contributions of the GIRF of second order and higher may be taken into account by such a special treatment in the reconstruction.

According to an example, for calculating low frequency contributions to the gradient impulse function, the first set of the pulse sequence commands is configured for repeatedly exciting the passive local probes by repeatedly applying radio frequency pulses when acquiring the first magnetic resonance data. This may be beneficial, because slowly decaying eddy currents, e.g. 200 ms long, may be captured. In other words, the contributions to the GIRF pertaining to very low frequencies may efficiently be determined.

According to an example, the magnetic resonance imaging system comprises a second group of passive local probes, wherein the second group of passive local probes comprises a plurality of physical phantom probes which are located spaced apart from each other within the magnetic resonance imaging system, and wherein the acquiring of the first magnetic resonance data by repeatedly exciting the passive local probes comprises subsequently exciting the first and second group of passive local probes in an interleaved fashion. This may enable a fast repetition, because the physical phantom probes of one group may be excited in probe dead time of the other group. The RF excitation and signal acquisition of one group of passive local probes, while in the other group of passive local probes having been RF excited earlier T1-relaxation takes place. Thus, the acquisition time of the response signals compared with a single larger group comprising the same number of passive local probes as the first and second group together is reduced. By reducing the acquisition time, the T2-relaxation effect in the acquired response signals may be reduced as well. In case of long acquisition times problems may be caused by the finite lifetime of the magnetization in the physical phantom probes, i.e. by a finite spin-spin relaxation time T2. A finite T2 may limit the frequency resolution of the GIRF measurement, i.e. complicating or even preventing a determination of low frequency contributions to the GIRF. This limitation may be overcome by allowing switching between different groups of physical phantom probes used. The switching may allow interleaving/multiplexing on a very short time scale. Using localized parallel transmission or other mechanisms described herein which are capable of dedicatedly hiding the transmit RF for certain δ-probes and some signal post-processing may allow a continuous monitoring of the gradient response.

According to an example, more than two groups of passive local probes, like e.g. four, five or six groups, may be used in an interleaved manner to further reduce the acquisition time.

According to an example, the selection of the individual group being RF excited may be implemented by using spatial selective excitations, e.g. by way of a multi-channel RF excitation that controls the spatial distribution of the RF excitation field, such that only the passive local probes of the selected group are excited, or by controllable shielding and un-shielding of the respective passive local probes.

According to an example, each group of passive local probes comprising controllable shielding structures may be excited by using a hard, very short RF pulse, e.g. of 10 μs, if the respective group is selected by controlling the shielding structures of the group. During the RF pulse the field monitoring system is blind, but using the assumption that the gradient system is frequency limited, e.g. to 20 kHz, the measured phases of the used arrays may be interpolated in the different spatial orders allowing for continuous monitoring. Dead times due to the RF pulse may e.g. be in the order of 10-50 μs. In order to keep the excitation period as short as possible physical phantom probes may be used without applying selection gradients as used for the generation of virtual δ-probes, which result in excitation processes of e.g. roughly 1 ms to 10 ms duration. By keeping the excitation period as short as possible multiplexing may be facilitated.

The invention may enable the RF excitation and signal acquisition of one group of probes while in another group of probes having been RF excited earlier T1-relaxation takes place. Thus, the acquisition time of the response signals from a larger group of probes may be reduced and T2-relaxation effects in the acquired response signals may be less. For such a set up the physical δ-probe water content has to be adapted appropriately by design to facilitate the above mentioned T1 relaxation in the shorten inter RF pulse intervals.

To derive the GIRF or at least an approximation of the same, magnetic resonance signals may be induced by a sequence of gradient pulses and brief, i.e. hard, (ultra) wide band, RF excitations. The induced magnetic resonance signals may be received and disentangled into individual signal contributions of the individual physical phantom probes. The disentanglement may e.g. be done by way of a parallel imaging technique, like e.g. SENSE.

According to an example, the passive local probes of the first and second group of passive local probes comprise controllable shielding structures and the group of passive local probes being excited is selected by controlling the shielding structures.

Each passive local probe may be arranged in a shielding structure. The shielding structures may be manipulated by external switching which may change either the capacity or inductance of the shielding structures. Thus, the shielding structures may be tuned from RF-shielding to transparent and vice versa. According to an example, the shielding structures may be provided by small coils. According to an example, the shielding structures may be provided in form of a resonator coil. The resonator may be tuned to a resonance frequency, thus amplify an external RF field generated by an RF pulse.

The shielding structures of passive local probes of the same group may be controlled simultaneously such that all passive local probes belonging to the same group may be tuned and detuned simultaneously using simple electronics driven by the magnetic resonance imaging system.

According to an example, the shielding structures may be provided in form of B0-lifting coils which are placed around the passive local probe. The B0-lifting coils may be able to shift the B0-field very locally during an RF pulse out of the magnetic resonance condition for excitation, without disturbing the other non-switched shielding structures. Thus, all the other passive local probes located in non-switched shielding structures, may be excited by the RF pulse.

In a further aspect, the invention provides a computer program product comprising machine executable instructions for execution by a processor of a magnetic resonance imaging system for controlling the magnetic resonance imaging system. The magnetic resonance imaging system comprises a magnetic resonance imaging magnet for generating a main magnetic field for orientating the magnetic spins of nuclei of a subject located within an imaging volume and at least one magnetic field gradient system for generating a gradient magnetic field for spatial encoding of a magnetic resonance signal of spins of nuclei within the imaging volume. The gradient system comprises a gradient amplifier and a gradient coil. The magnetic resonance imaging system further comprises a radio-frequency system comprising a coil array with a plurality of coil elements configured for acquiring magnetic resonance data using parallel imaging. Execution of the machine executable instructions causes the processor to control the magnetic resonance imaging system to acquire by the coil elements first magnetic resonance data simultaneously from a plurality of passive local probes using a first set of the pulse sequence commands, wherein the local probes are located spaced apart from each other and to disentangle contributions to the first magnetic resonance data from the individual local probes using the parallel imaging protocol. The magnetic resonance imaging system is further controlled to calculate for the magnetic resonance imaging system a gradient impulse response function of the gradient system using the first magnetic resonance data from the local probes. Further, the magnetic resonance imaging system is controlled to a correction for compensating a deviation of the behavior of the gradient system from a predefined behavior using the gradient impulse response function. Generating the magnetic resonance images comprises acquiring second magnetic resonance data from the subject with a second set of the pulse sequence commands by the coil elements and reconstructing the magnetic resonance images of the subject using the second magnetic resonance data.

A computer program product may in particular be used for upgrade already install sets of executable instructions and to enable magnetic resonance imaging systems to be operated by a processor according to the method claimed here.

In a further aspect, the invention provides a method for operating a magnetic resonance imaging system. The magnetic resonance imaging system comprises a magnetic resonance imaging magnet for generating a main magnetic field for orientating the magnetic spins of nuclei of a subject located within an imaging volume and at least one magnetic field gradient system for generating a gradient magnetic field for spatial encoding of a magnetic resonance signal of spins of nuclei within the imaging volume. The gradient system comprising a gradient amplifier and a gradient coil. The magnetic resonance imaging system further comprises a radio-frequency system comprising a coil array with a plurality of coil elements configured for acquiring magnetic resonance data using parallel imaging and a memory storing machine executable instructions and pulse sequence commands. The pulse sequence commands are configured for controlling the magnetic resonance imaging system to acquire the magnetic resonance data according to a parallel imaging protocol. Furthermore, the magnetic resonance imaging system comprises a processor for controlling the magnetic resonance imaging system. The method comprises acquiring by the coil elements first magnetic resonance data simultaneously from a plurality of passive local probes using a first set of the pulse sequence commands, wherein the local probes are located spaced apart from each other. The method further comprises disentangling contributions to the first magnetic resonance data from the individual local probes using the parallel imaging protocol and calculating for the magnetic resonance imaging system a gradient impulse response function of the gradient system using the first magnetic resonance data from the local probes. The method further comprises determining a correction for compensating a deviation of the behavior of the gradient system from a predefined behavior using the gradient impulse response function and applying the correction for generating magnetic resonance images of a subject. Generating the magnetic resonance images comprises acquiring second magnetic resonance data from the subject with a second set of the pulse sequence commands by the coil elements and reconstructing the magnetic resonance images of the subject using the second magnetic resonance data.

BRIEF DESCRIPTION OF THE DRAWINGS

In the following, preferred embodiments of the invention will be described, by way of examples only with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
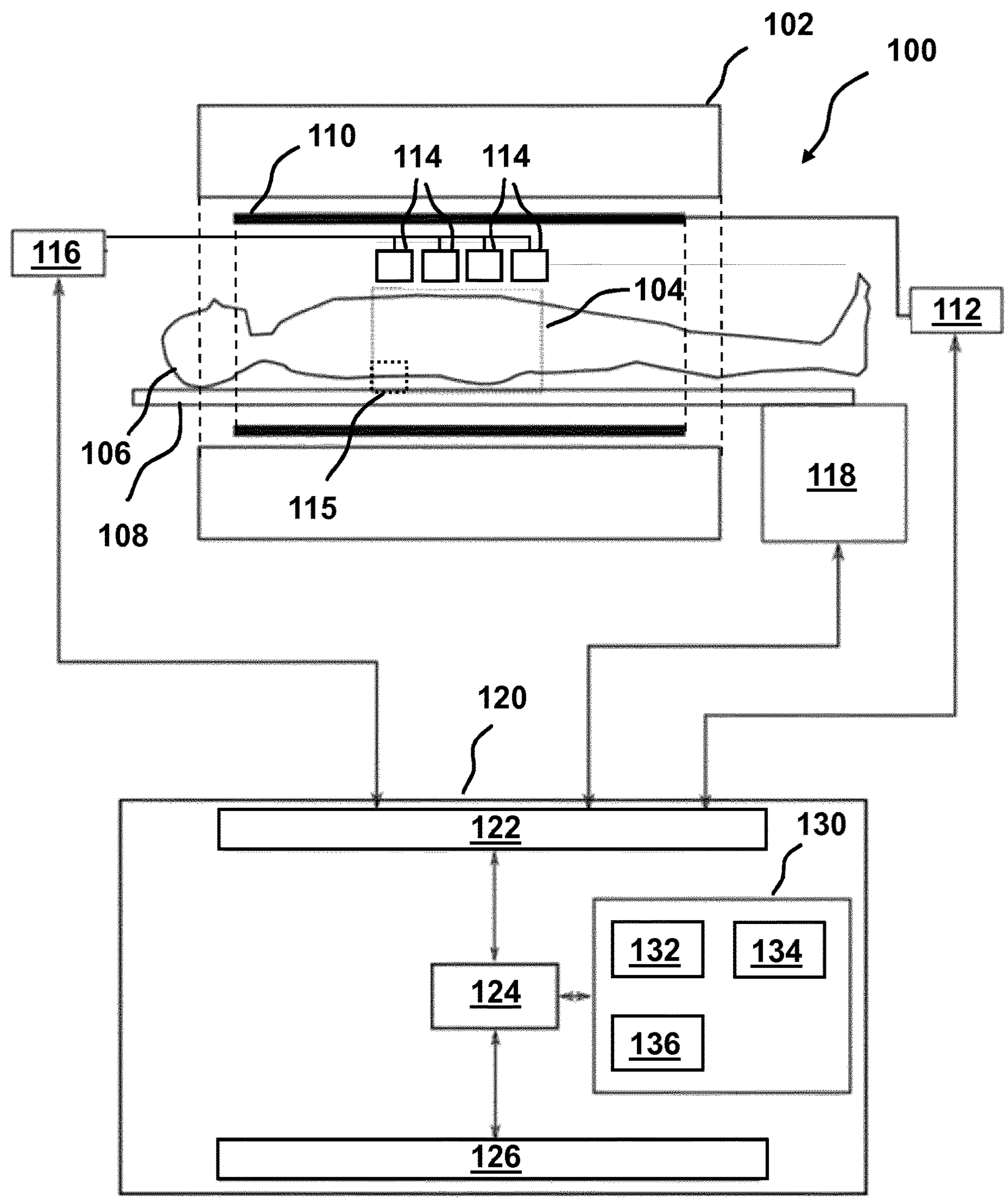
FIG. 1 shows a schematic diagram of an exemplary magnetic resonance imaging system.

FIG. 1 shows an example of a magnetic resonance imaging system 100 according to an embodiment of the invention. The magnetic resonance imaging system 100 comprises a magnet 102. Within the magnet 102 there is an imaging volume 104. The imaging volume 104 is a zone where the magnetic field of the magnet 102 is uniform enough to perform magnetic resonance imaging. The subject 106 can be seen reposing on a subject support 108 with a portion of the subject 106 located within the imaging volume 104. The subject support 108 is attached to an optional actuator 121 that is able to move the subject support 108 and the subject 106 through the imaging volume 104. Also within a bore of the magnet 102 is a magnetic field gradient coil 110. The magnetic field gradient coil 110 typically comprises three separate gradient coil systems for the x, y, and z-directions. Typically, the z-direction is aligned with the magnetic field lines within the imaging volume 104. A gradient amplifier 112 is shown as being connected to the magnetic field gradient coil 110.

Above the imaging volume 104 is a coil array 114 comprising coil elements. The coil array 114 is shown with for coil elements. The actual number of antennal elements and their arrangement space depends upon the geometry being imaged by the coil array 114. Each coil element may be configured for transmitting and/or receiving RF signals. The coil array 114 is connected to a radio frequency transceiver 116. The radio frequency transceiver 116 may be replaced in some embodiments by separate transmitters and receivers. Both the gradient amplifier 112 and the radio frequency transceiver 116 may be connected to a hardware interface 122 of a computer 120. According to examples, a body coil (not shown) may be added for transmitting and/or receiving RF signals.

Furthermore, according to some embodiments at least one physical phantom probe 115 may be provided. According to embodiments a plurality of physical phantom probe 115 may be provided. According to alternative embodiments, no additional physical phantom probe 115 may be provided. In the later case, the physical phantom probe may rather be provided in form of the subject 106 itself. In case of an additional physical phantom probe 115, the same may for example be positioned within the imaging volume 104, preferably while the no subject 106 is positioned there and be moved aside or completely removed before the subject 106 enters the imaging volume 104, in the vicinity of the coil elements 114 or within one of the coil elements 114. Furthermore, in case the physical phantom probe 115 is provided with a controllable shielding structure, the respective shielding structure may as well be connected to a hardware interface 122 of a computer 120 (not shown).

Within the computer 120, a processor 124 is able to send and receive instructions from the hardware interface 122. By means of the hardware interface 122 the processor 124 is able to control the operation and function of the magnetic resonance imaging system 100 including the gradient system. The processor 124 is also connected to a user interface 126 which may be adapted for displaying data or renderings of magnetic resonance imaging to a user. The user interface 126 may also be adapted for receiving commands or instructions from a user for operating the magnetic resonance imaging system 100. The processor 124 is also connected to a computer memory 130. Although a single computer 120 and a single processor 124 are shown it is understood that the terms a computer and a processor may refer to a plurality of computers and/or processors.

In the computer memory 130 a first and a second pulse sequence 132, 134 are stored. A pulse sequence 132 as used herein encompasses a set of instructions for operating a magnetic resonance imaging system 100 for acquiring magnetic resonance data from a plurality of passive local probes for calculating components of the GIRF. Herein the pulse sequence 134 comprises a set of instructions for acquiring magnetic resonance data of the subject 106 in order to reconstruct one or more magnetic resonance images. The memory 136 further comprises a set of instructions 136 for implementing a parallel imaging protocol for disentangling at the signals received, when applying the pulse sequence 132. The parallel imaging protocol may for example use SENSE, GRAPPA, or SMASH. The memory 136 may in particular be configured to store a representation of the gradient system behavior, e.g. a GIRF, acquired by applying the pulse sequence 132 to the plurality of passive local probes.

Figure 2:
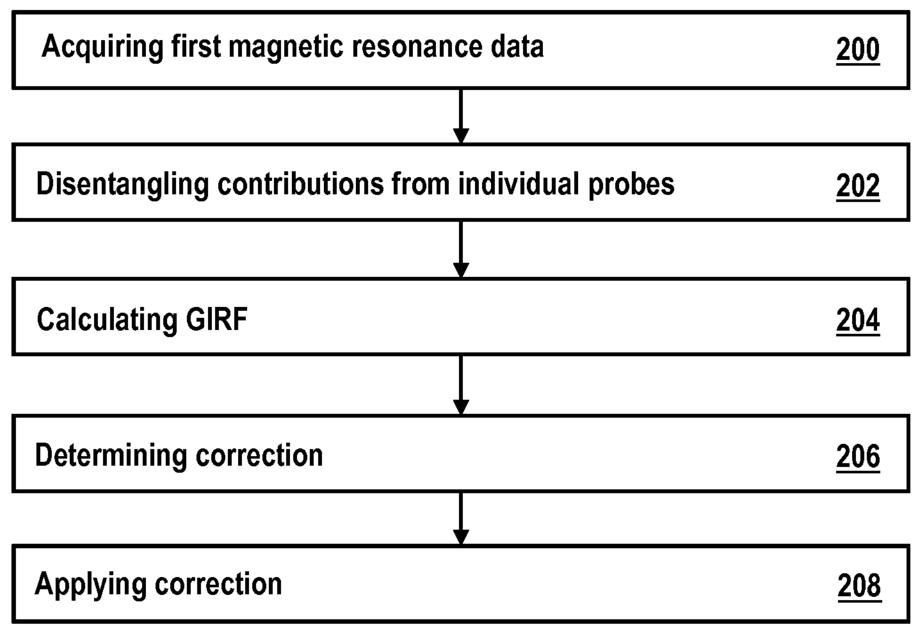
FIG. 2 shows a block diagram of a first exemplary method, FIG. 3 show schematic diagrams of exemplary multi-slice excitations, FIG. 4 show schematic diagrams of a first physical probe array.

FIG. 2 shows an exemplary method for determining the gradient impulse response function. In block 200, first magnetic resonance data is acquired simultaneously from a plurality of passive local probes using the coil elements of the magnetic resonance imaging system. In block 202, contributions to the first magnetic resonance data from the individual local probes are disentangled using a parallel imaging protocol. In block 204, a gradient impulse response function of the gradient system is calculated using the first magnetic resonance data from the local probes. In block 206, a correction for compensating a deviation of the behavior of the gradient system from a predefined behavior using the gradient impulse response function is determined. In block 208, the correction is applied for generating magnetic resonance images of a subject. Generating the magnetic resonance images may comprise acquiring second magnetic resonance data from the subject to be scanned which is located within the imaging volume. A second set of the pulse sequence commands may be used to acquire the second magnetic resonance data by the coil elements and reconstruct the magnetic resonance images of the subject using the second magnetic resonance data. The corrections may either be applied to the hardware settings e.g. modifying the magnetic fields being generated or to the software settings, e.g. modifying the reconstruction of the magnetic resonance images from the second magnetic resonance data.

Figure 3A:
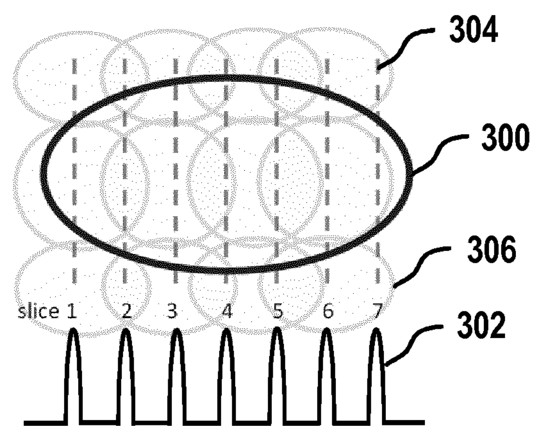
Figure 3B:
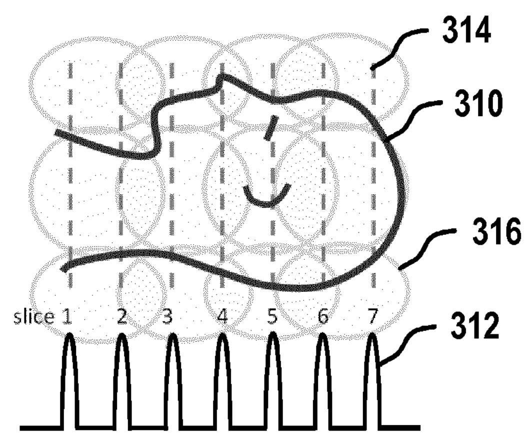

FIGS. 3A and 3B show exemplary multi-slice excitations outlining the basic principle to accelerate the measurement. FIG. 3A shows a first multi-slice excitation of water phantom probe 300. Two separate single slice-selective experiments may be performed in a water phantom probe 300, which is depicted with an elliptic shape for illustration. Seven virtual δ-probes 302 are simultaneously generated spaced apart from each other in the phantom probe 300. According to examples, the δ-probes 302 may be arranged in an equidistant manner. According to alternative examples, the δ-probes 302 may be arranged in a non-equidistant manner. Each δ-probes 302 corresponds to a slice 304 extending perpendicular to the longitudinal axes of the phantom probe 300. According to a further example, the phantom probe may a spherical shape. In case of a sphere, the δ-probes may correspond to slices all arranged perpendicular to a common radial direction of the sphere which may be freely chosen. After the slice selective excitation, the gradient waveform in question, e.g. a chirp gradient pulse, may be applied. Repeating this measurement without the gradient pulse allows charactering the off-resonance bias at the locations of the δ-probes. After signal subtraction, signal evaluation like e.g. a multi-frequency evaluation, may be done fitting on top the processed responses from the seven locations to model of sufficient order to extract zeroth, first, and second spatial order terms. Existing seven virtual δ-probes 302 even higher order terms may be extracted. Thus, by performing two measurements using a multi-band RF excitation pulse sequence with and without the magnetic field gradient, e.g. in form of a chirp gradient, may be sufficient for GIRF mapping up to e.g. second or third order. Based on the magnetic resonance signals received from the employed phased array indicated by the small circles 306 and using e.g. a multi-band SENSE reconstruction protocol, the individual signal contributions for all of the seven individual slices may be separated.

FIG. 3A shows an example using a one-dimensional multi-band excitation mapping only one gradient direction. Such an approach may for example be useful in multi-slice EPI fMRI applications where the sequence load is on the read gradient and a real-time characterization thereof may be sufficient for optimizing image reconstruction.

FIG. 3B shows a schematic diagram of a second exemplary multi-slice excitation. The setup show in FIG. 3B differs from the one shown in FIG. 3A in that instead of the additional phantom probe 300 the subject 310 to be scanned is used as a common physical probe in which the δ-probes 312 are excited in-vivo. Again for example seven δ-probes 312 may be generated by exciting the slices 314 using a multi-band RF excitation pulse sequence. The resulting magnetic resonance signals may be received from the phased array indicated by the small circles 316 and separated using e.g. a multi-band SENSE reconstruction protocol. If the lifetime of the transverse magnetization in the individual slices is sufficiently long and if intro-voxel dephasing can be neglected, the two-shot approach described above for FIG. 3A may also be applied while the subject 310, like e.g. a patient, to be actually scanned is in place.

A further refinement to the examples shown in FIGS. 3A and 3B may be the embedding of a one-dimensional multi-band excitation into spin echo type of experiments addressing an additional spatial direction for two-dimensional encoding. Such an approach may produce a two-dimensional array of δ-probes, which allows measuring two or more physical channels while being simultaneously active.

In case of multiple spatially confined δ-probes being excited, their signals may be separated using a more general solution to the SENSE equation than that is used in a pure one-dimensional multi-band application that might also include elements of an inverse imaging approach using a combination of a large N coil array with a linear estimation approach to achieve the acquisition of magnetic resonance data.

Figure 4A:
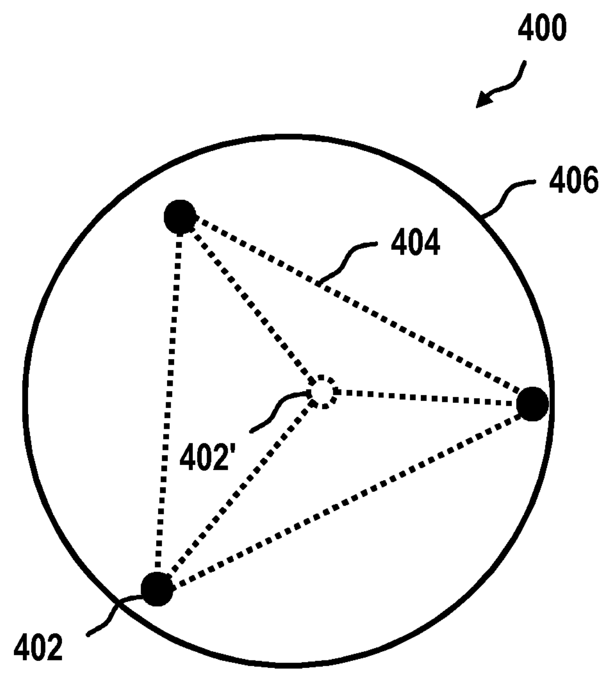
Figure 4B:
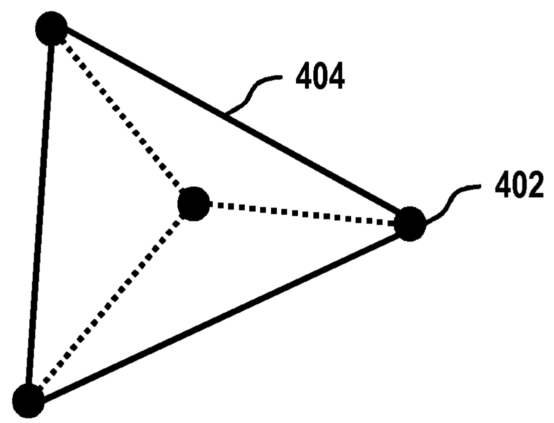

FIG. 4 show a first physical probe array 400. The probe array 400 comprises a group of physical phantom probes provided in form of doped-water-filled spheres 402, 402' which are located within a support body 406. The embodiment shown in FIG. 4 comprises four spheres 402, 402' at the corners of a polyhedron in form a regular tetrahedron 404. The sphere 402' is located at the backside of the support body 406. According to other examples the physical phantom probes 402, 402' may be distributed at the corners of an octahedron or a cube, wherein the number of physical phantom probes may preferably correspond to the number of corners of the respective polyhedron used. The diameter of the spheres 402, 402' may be 5 mm. According to embodiments, the diameter of the spheres 402, 402' may be 2 mm to 10 mm.

The total size of that support body 400 may be configured such that it fits in a commonly available commercial RF coil, like e.g. a head coil. According to an example, the support body 400 may be provided in form of a homogenous body comprising cavities in which the doped-water-filled spheres 402, 402' are located. According to an example, the homogeneous support body 400 may be provided in form of a massive sphere except for the cavities containing no magnetic resonance active protons, but having a susceptibility similar to that of water. For example, the support body 400 made of plastic, like e.g. polymethyl methacrylate (PMMA). The support body 400 may comprise four or more, like e.g. six, or eight, cavities located at the perimeter of the sphere 400 in which the doped-water-filled spheres 402, 402' are located. The diameter of the sphere may for example be 200 mm, comprised by the interval from 190 mm to 210 mm, or the interval from 175 mm to 225 mm.

The support body 400 with the spherical probes 402, 402' may be positioned in a receiving coil of the magnetic resonance imaging system, e.g. in a head coil. According to an example, a positioning device may be provided which defines the relative position of support body 400 and the respective receiving coil. Signals from the spherical probes 402, 402' may be induced by playing out gradient pulses as well as hard RF pulses. The respective signals from these e.g. four spheres 402, 402' may be received by receiving coils of the magnetic resonance imaging system and disentangled using a SENSE-like technique. Thereby the signal contribution from each of the spherical probes 402, 402' may be reconstructed. The frequency of the obtained signal may be indicative of the gradient field at the position of the spherical probes 402, 402'.

Figure 5:
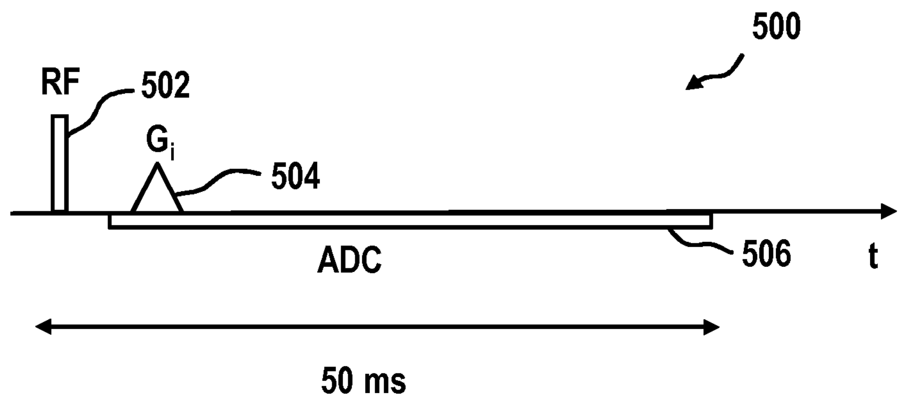
FIG. 5 shows a schematic diagram of a first exemplary pulse sequence.
Figure 6:
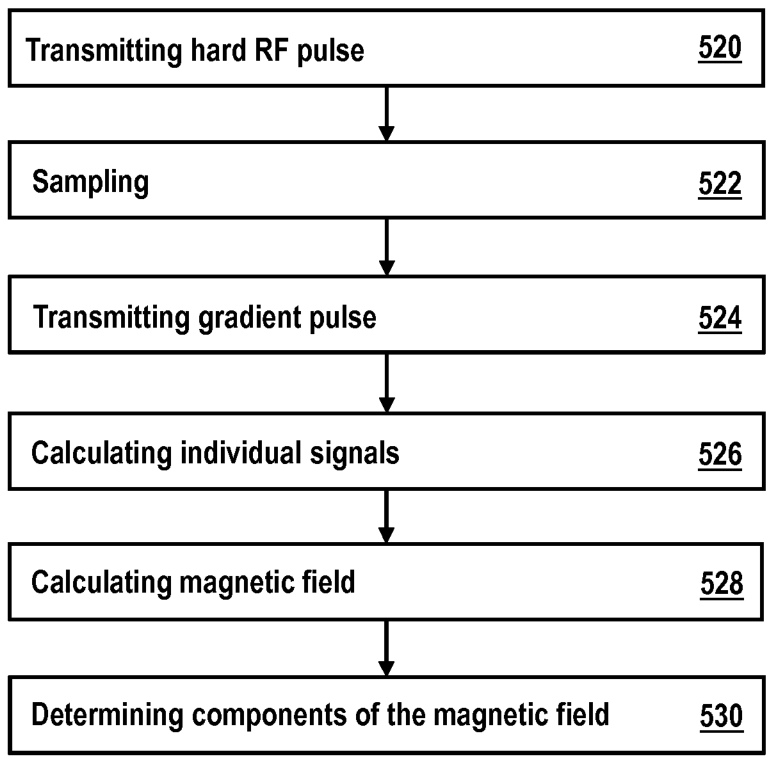
FIG. 6 shows a block diagram of a second exemplary method.

FIG. 5 shows a first exemplary pulse sequence 500, while FIG. 6 shows a method for applying the pulse sequence 500. In order to measure the full frequency spectrum of the GIRF with a sufficient precision, i.e. taking into account high frequency as well as low frequency contributes, a plurality of measurements may be performed, using different pulse sequences optimized for measuring different parts of the spectrum. For example, a high frequency optimized pulse sequence and a low-frequency optimized measurement may be performed. FIG. 5 shows a first exemplary pulse sequence 500 which is optimized for measuring high frequency contributions. A method for measuring high frequency contributions using the pulse sequence 500 may be the following:

In block 520, a hard RF pulse 502 is transmitted. In block 522, sampling ADC 506 of the signals received by all coil elements is started and the individual signals pertaining to each of the doped-water-filled spheres are calculated. The time gap between transmitting the hard RF pulse 502 and starting the sampling 506 may correspond to a few times the T2 of the material of the support body of FIG. 4A.

In block 524, a gradient pulse is transmitted for the gradient channel $G_i$ from which the GIRF is to be determined. The gradient $G_i$ 504 may for example have a triangular shape. Due to choosing a small size of the physical phantom probes in form of the doped-water-filled spheres 402, 402', e.g. a 5 mm diameter, a low gradient $G_i$ 504 may be applied. For measuring high frequency contributions to the GIRF the gradient $G_i$ 504 may be short with a length of e.g. 200 μs.

The phase of the signals pertaining to each water sphere indicate the integral of the actual magnetic field at the position of that sphere which, assuming small pulses, accrued from the RF-pulse center till the time of the sample. In block 526, the signals pertaining to the individual water sphere are calculated. In block 528, the magnetic field is calculated using the integral of the field. In block 530, given physical phantom probes at four tetrahedral points, the B0-, Gx-, Gy- and Gz-components of the magnetic field may be determined. This method may be repeated for the remaining two gradient channels. According to examples, the method may further be repeated without driving any gradient.

Figure 7:
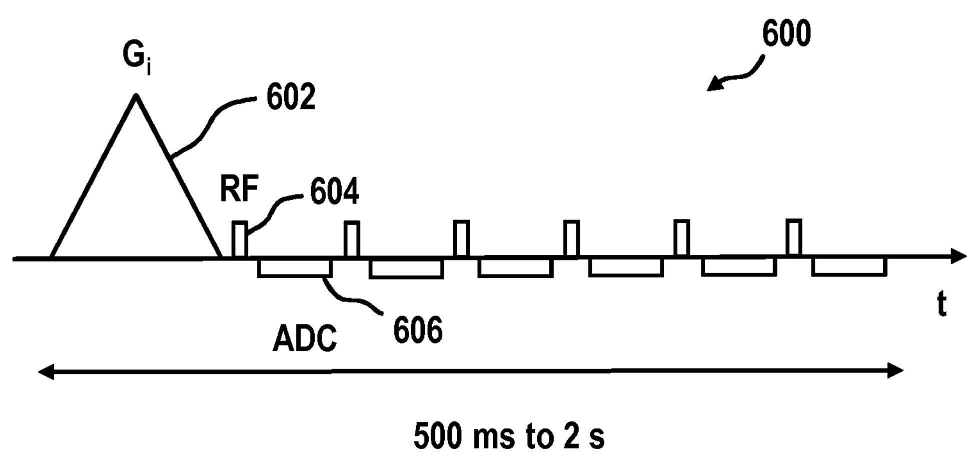
FIG. 7 shows a schematic diagram of a second exemplary pulse sequence.
Figure 8:
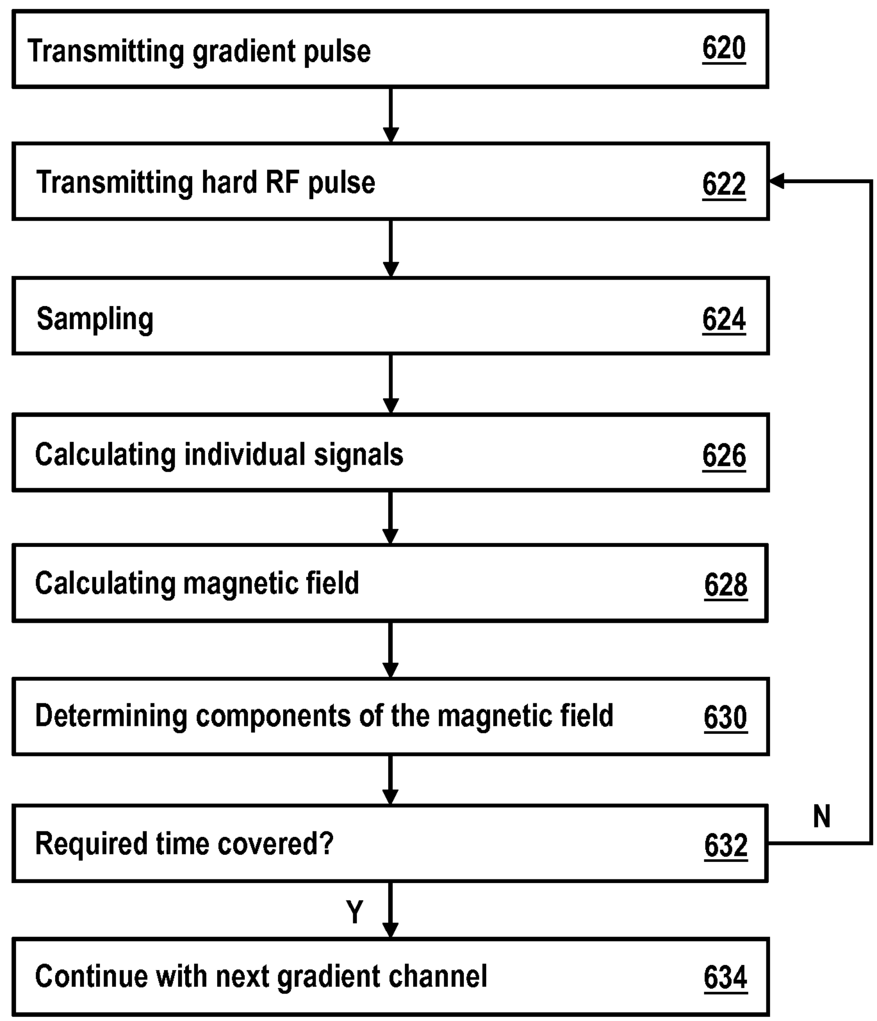
FIG. 8 shows a schematic diagram of a second physical probe array.

FIG. 7 shows a second exemplary pulse sequence 600, while FIG. 8 shows a method for applying the pulse sequence 600. A method for measuring low frequency contributions using the pulse sequence 600 may be the following:

In block 620, a gradient pulse is transmitted for the gradient channel $G_i$ from which the GIRF is to be determined. The gradient $G_i$ 602 may for example have a triangular shape. The gradient $G_i$ 602 may for example have a length of 100 ms. In block 622, a hard RF pulse 604 is transmitted. In block 624, the response signals are sampled ADC 606 by all coil elements. In block 626, the signals pertaining to the individual water sphere are calculated. The phase of the signals pertaining to each water sphere indicate the integral of the actual magnetic field at the position of the respective sphere which, assuming small pulses, accrued from the RF-pulse center till the time of the sample. In block 628, the magnetic field is calculated using the integral of the field. In block 630, given physical phantom probes at four tetrahedral points, the B0-, Gx-, Gy- and Gz-components of the magnetic field may be determined. Repeating steps 622 to 630 until sufficient time for measuring the longest response effect is covered.

Considering a physical phantom probe provided in form of a water-filled sphere with a diameter of e.g. 5 mm, the spins within that sphere may de-phase in about 50 ms. The water may be doped to a value of T1/T2 of approximately the same time. In case the GIRF is to be determined up to e.g. 1 s, then, after each gradient pulse, about 20 excitations have to be performed for the measurement of the low-frequency contributions. After some time, like e.g. 2 s, the same may be performed for a different gradient direction or for a different strength and length which may allow to better focus on very-long-lived components of the gradient impulse response function. Thus, a full set of components of the GIRF, up to linear order, may be determined in approximately 16 s. This time scale may be well below the thermal time constants of the gradient system. By repeating the GIRF-acquisition for a multiplicity of thermal states, a complete characterization of the gradient-system behavior may be achieved.

According to examples, the methods of FIGS. 6 and 8 may be preceded by a set of localization measurements for determining the location of the physical phantom probes. Each localization measurement may consist of switching a gradient to a low but constant value, waiting for a few seconds, then giving a hard RF pulse and measuring the frequencies of the result. The frequencies of the result may provide the positions in gradient coordinates and in the direction of the switched gradient. The set of localization measurements may consist of measuring the localization for the x, y and z gradient and also without driving any gradient, i.e., establishing x, y and z-locations.

Figure 9:
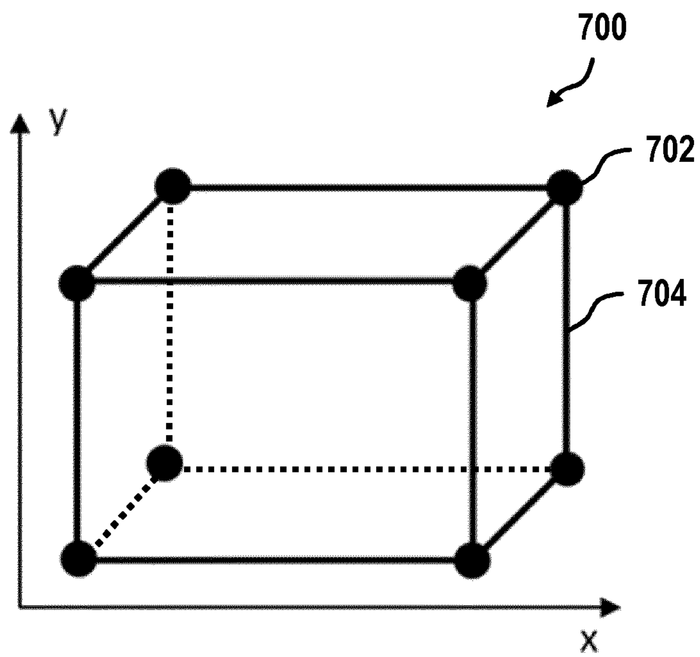
FIG. 9 shows a block diagram of a third exemplary method.

FIG. 9 shows a second physical probe array 700. Passive local probes used for measuring the GIRF are provided in form of a plurality of physical phantom probes 702, which are located spaced apart from each other and are locally resolved using phased array reception. Here, eight physical phantom probes 702 are depicted arranged at the corners of an octahedron 704.

Figure 10:
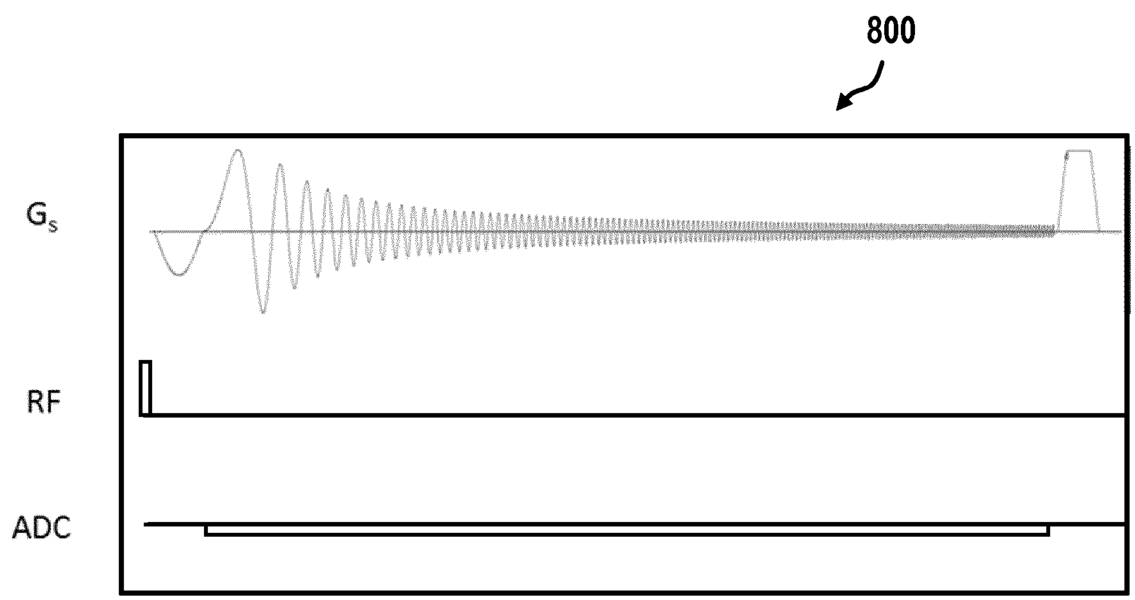
FIG. 10 shows a schematic diagram of a third pulse sequence.

FIG. 10 shows a third pulse sequence 800 for measuring the GIRF using the physical probe array 700 of FIG. 9. The pulse sequence 800 used for measuring the GIRF comprises a chirp gradient $G_s$ in form of a chirp gradient pulse, a hard RF pulse and an ADC. The hard RF pulse is non-selective such that all physical phantom probes 702 are excited. The response signals of the individual physical phantom probes 702 are measured using the phased array coil provided by the coil elements, wherein the ADC works for each coil element individually.

Figure 11:
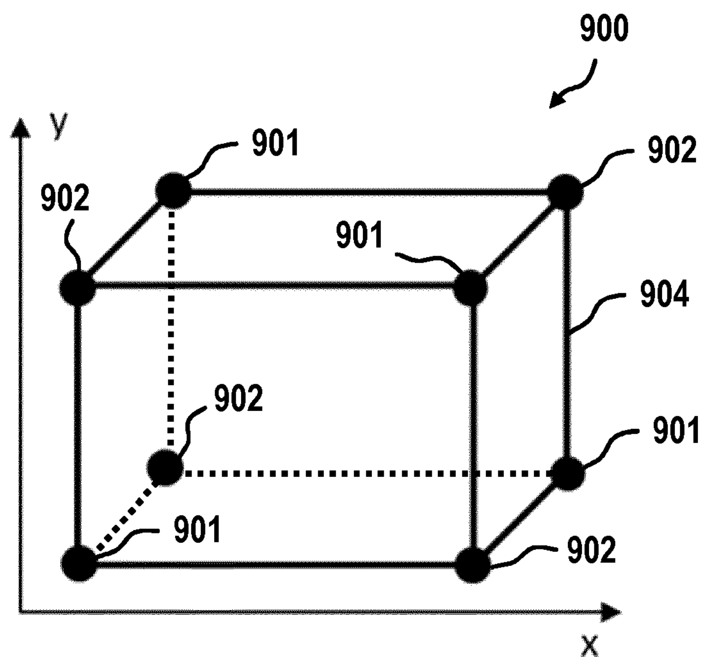
FIG. 11 shows a schematic diagram of a third physical probe array.

FIG. 11 shows a third physical probe array 900 illustrating the basic principle of a multiplexed measurement using the two different groups of passive local probes 901, 901. A first group comprises the passive local probes 901, a second group comprises the passive local probes 902. Here, each group comprises four physical phantom probes 901 and 902, respectively. The physical phantom probes 901, 902 are arranged at the corners of an octahedron 904. The different groups of passive local probes 901, 902 may be selectively excited using by appropriate spatially shaped transmit RF fields. Thus, the RF exposure during transmission may be locally restricted. This may be achieved by parallel transmission (pTx) and an appropriate complex superposition of the local pTx coils, i.e. the coil elements, resulting in a B1 shimming.

According to an alternative example the global RF field may temporally be locally amplified or shielded near the passive local probes 901, 902 of the group local probes to be excited or not excited, respectively. For shielding and unshielding of the passive local probes 901, 902 appropriate switches driven by the magnetic resonance imaging system may be used as shown e.g. in FIG. 12. Thereby, the multiple passive local probes 901, 902 of the different groups may be distinguished and multiplexed during operation on a very short time scale, resulting in rather short dead-times.

Figure 12:
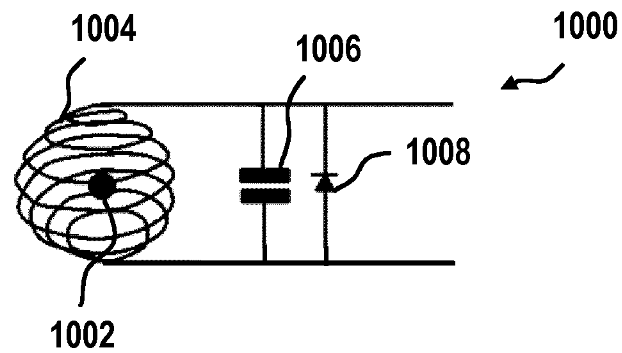
FIG. 12 shows a schematic diagram of a with a resonator tuned shielding.

FIG. 12 shows a physical phantom probe 1002 with a resonator tuned shielding 1004. The physical phantom probe 1002 is provided with a resonance circuit 1000 comprising a coil 1004. The coil 1004 is operationally connected with a capacitor 1006 and a diode 1008. The coil 1004 may amplify the external RF field by more than an order of magnitude. Thus, excitation may be performed with a 1° RF pulse resulting in significant excitation, e.g. of 30°, in the physical phantom probe 1002, when the surrounding coil 1004 is tuned to be resonant. Thereby, a field focusing effect may be implemented. By driving the pin diode 1008, e.g. electrically or by light, the capacity of the circuit 1000 is changed. Thereby, the resonance circuit 1000 may be quickly tuned or detune such that the field focusing effect may be switched on and off, respectively. Physical phantom probes 1002, which are placed in detuned coils 1004 which are not resonant may not be significantly excited. Thus, non-excited or not significantly excited physical phantom probes 1002 may be able to relax to thermal equilibrium. The coil 1004 may only be switched on and off for amplifying the external magnetic field. No magnetic resonance data may be acquired via the coil 1004.

Figure 13:
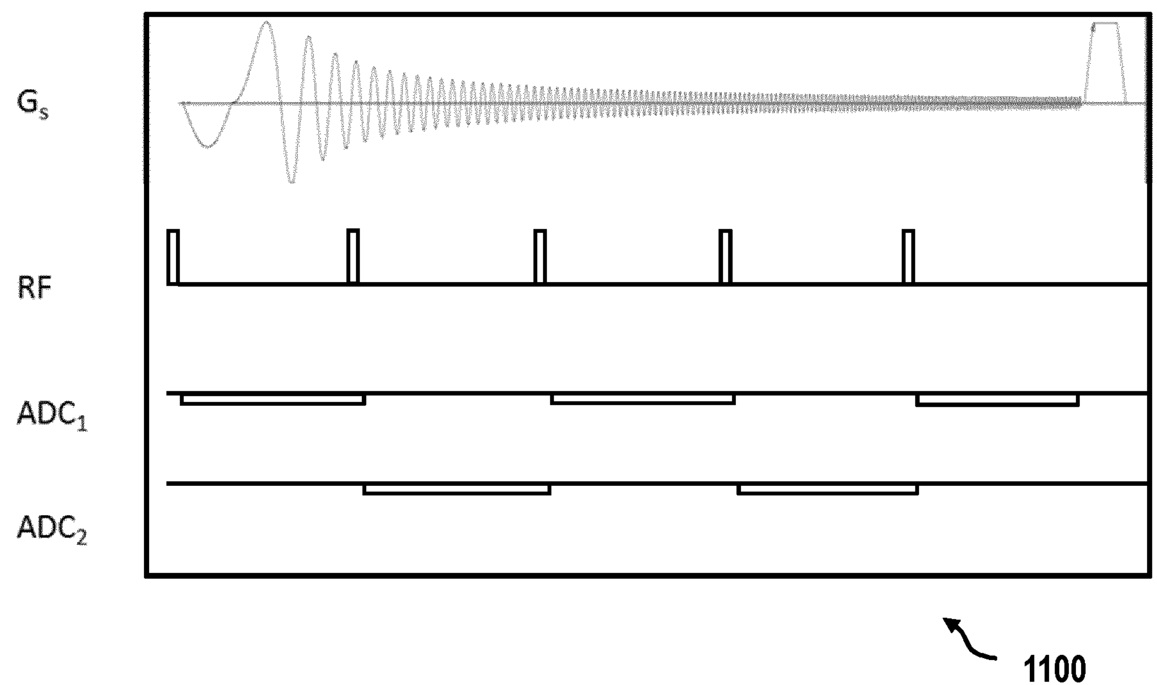
FIG. 13 shows a schematic diagram of a fourth pulse sequence.

FIG. 13 a fourth pulse sequence 1100 for measuring the GIRF using the physical probe array 900 of FIG. 11 with the shielding of FIG. 12. During the sampling of one group of passive local probes, T1-relaxation takes place in the other group of passive local probes allowing continuing with the next excitation. Thus, the measuring process of the GIRF may be performed by alternating between the two groups of passive local probes. Due to the fact that only short non-selective RF excitation pulses are used, the dual group system of FIG. 11 may be able to follow the phase coherence of the different spatial orders of the gradient system switched.

While the invention has been illustrated and described in detail in the drawings and foregoing description, such illustration and description are to be considered illustrative or exemplary and not restrictive, the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

100 magnetic resonance imaging system
102 magnet
104 imaging volume
106 subject
108 subject support
109 gradient amplifier
110 magnetic field gradient coil
112 gradient amplifier
114 coil elements
115 passive local probes
116 radio frequency transceiver
118 actuator
120 computer
122 hardware interface
124 processor
126 user interface
130 computer memory
132 first pulse sequence
134 second pulse sequence
136 SENSE protocol
300 physical probe
302 δ-probe
304 slice
306 separate MR signal received
310 physical probe
312 δ-probe
314 slice
316 separate MR signal received
400 set of passive probes

402 passive local probe
402' passive local probe
404 tetrahedron
406 support body
500 pulse sequence
502 RF pulse
504 gradient pulse
506 sampling pulse
600 pulse sequence
602 RF pulse
604 gradient pulse
606 sampling pulse
700 set of passive probes
702 passive local probe
704 polyhedron
800 pulse sequence
900 set of passive probes
901 passive local probe of first array
902 passive local probe of second array
904 polyhedron
1000 resonance circuit
1002 passive local probe
1004 shielding
1006 capacitor
1008 diode
1100 pulse sequence

The invention claimed is:

1. A magnetic resonance imaging system comprising:

a magnetic resonance imaging magnet for generating a main magnetic field for orientating the magnetic spins of nuclei of a subject located within an imaging volume, at least one magnetic field gradient system for generating a gradient magnetic field for spatial encoding of a magnetic resonance signal of spins of nuclei within the imaging volume, the gradient system comprising a gradient amplifier and a gradient coil, a radio-frequency system comprising a coil array with a plurality of coil elements configured for acquiring magnetic resonance data using parallel imaging, a non-transitory computer readable memory storing machine executable instructions and pulse sequence commands, wherein the pulse sequence commands are configured for controlling the magnetic resonance imaging system to acquire the magnetic resonance data according to a parallel imaging protocol, a processor for controlling the magnetic resonance imaging system, wherein execution of the machine executable instructions causes the processor to control the magnetic resonance imaging system to:

acquire by the coil elements first magnetic resonance data simultaneously from a first group of passive local probes using a first set of the pulse sequence commands, wherein the first group of passive local probes comprises a plurality of passive local probes located spaced apart from each other;

disentangle contributions to the first magnetic resonance data from the individual local probes using the parallel imaging protocol, calculate for the magnetic resonance imaging system a gradient impulse response function of the gradient system using the first magnetic resonance data from the local probes;

determine a correction for compensating a deviation of the behavior of the gradient system from a predefined behavior using the gradient impulse response function;

apply the correction for generating magnetic resonance images of a subject, wherein generating the magnetic resonance images comprises acquiring second magnetic resonance data from the subject with a second set of the pulse sequence commands by the coil elements and reconstructing the magnetic resonance images of the subject using the second magnetic resonance data.

2. The magnetic resonance imaging system of claim 1, wherein the first group of passive local probes comprises at least three passive local probes and wherein the calculation of the gradient impulse response function is at least up to second order contributions.

3. The magnetic resonance imaging system of claim 1, wherein the passive local probes comprise a plurality of virtual δ-probes excited spatially selectively and spaced apart from each other within a common physical probe arranged within the magnetic resonance imaging system.

4. The magnetic resonance imaging system of claim 3, wherein the common physical probe is a phantom probe.

5. The magnetic resonance imaging system of claim 3, wherein the common physical probe is the subject of which the magnetic resonance images are to be generated.

6. The magnetic resonance imaging system of claim 1, wherein the passive local probes comprise a plurality of physical phantom probes which are located spaced apart from each other within the magnetic resonance imaging system.

7. The magnetic resonance imaging system of claim 6, wherein the physical phantom probes have a spherical shape and are arranged at the corners of a regular polyhedron.

8. The magnetic resonance imaging system of claim 6, wherein the first set of pulse sequence commands is configured for a spatially non-selective excitation of the passive local probes and signal encoding of the resulting first magnetic resonance data based on parallel imaging.

9. The magnetic resonance imaging system of claim 6, wherein, for calculating low frequency contributions to the gradient impulse function, the first set of the pulse sequence commands is configured for repeatedly exciting the passive local probes by repeatedly applying radio frequency pulses when acquiring the first magnetic resonance data.

10. The magnetic resonance imaging system of claim 9, wherein the magnetic resonance imaging system comprises a second group of passive local probes, wherein the second group of passive local probes comprises a plurality of physical phantom probes which are located spaced apart from each other within the magnetic resonance imaging system, and wherein the acquiring of the first magnetic resonance data by repeatedly exciting the passive local probes comprises subsequently exciting the first and second group of passive local probes in an interleaved fashion.

11. The magnetic resonance imaging system of claim 10, wherein the passive local probes of the first and second group of passive local probes comprise controllable shielding structures and wherein the group of passive local probes being excited is selected by controlling the shielding structures.

12. The magnetic resonance imaging system of claim 1, wherein the first set of pulse sequence commands is configured for a spatially selective excitation of the passive local probes and signal encoding of the resulting first magnetic resonance data based on parallel imaging.

13. The magnetic resonance imaging system of claim 12, wherein the spatially selective excitation of the passive local probes comprises applying multi-dimensional or multi-band excitation pulses.

14. The magnetic resonance imaging system of claim 1, wherein the acquiring of the first magnetic resonance data comprises measuring a first set of magnetic resonance data from the passive local probes with the gradient field being applied to the passive local probes and a second set of magnetic resonance data from the passive local probes without applying the gradient field to the passive local probes, wherein off-resonance contributions are subtracted from the first magnetic resonance data, wherein the subtracting comprises subtracting the second set of magnetic resonance data from the first magnetic resonance data.

15. The magnetic resonance imaging system of claim 1, wherein the correction is applied to the generation of the magnetic fields when acquiring the second magnetic resonance data and/or to the reconstruction of the magnetic resonance images using the second magnetic resonance data.

16. A computer program product comprising machine executable instructions stored on a non-transitory computer readable for execution by a processor of a magnetic resonance imaging system for controlling the magnetic resonance imaging system, wherein the magnetic resonance imaging system comprises a magnetic resonance imaging magnet for generating a main magnetic field for orientating the magnetic spins of nuclei of a subject located within an imaging volume, at least one magnetic field gradient system for generating a gradient magnetic field for spatial encoding of a magnetic resonance signal of spins of nuclei within the imaging volume, the gradient system comprising a gradient amplifier and a gradient coil, a radio-frequency system comprising a coil array with a plurality of coil elements configured for acquiring magnetic resonance data using parallel imaging, wherein execution of the machine executable instructions causes the processor to control the magnetic resonance imaging system to:

acquire by the coil elements first magnetic resonance data simultaneously from a plurality of passive local probes using a first set of the pulse sequence commands, wherein the local probes are located spaced apart from each other;

disentangle contributions to the first magnetic resonance data from the individual local probes using the parallel imaging protocol, calculate for the magnetic resonance imaging system a gradient impulse response function of the gradient system using the first magnetic resonance data from the local probes;

determine a correction for compensating a deviation of the behavior of the gradient system from a predefined behavior using the gradient impulse response function;

apply the correction for generating magnetic resonance images of a subject, wherein generating the magnetic resonance images comprises acquiring second magnetic resonance data from the subject with a second set of the pulse sequence commands by the coil elements and reconstructing the magnetic resonance images of the subject using the second magnetic resonance data.

17. A method for operating a magnetic resonance imaging system, wherein the magnetic resonance imaging system comprises a magnetic resonance imaging magnet for generating a main magnetic field for orientating the magnetic spins of nuclei of a subject located within an imaging volume at least one magnetic field gradient system for generating a gradient magnetic field for spatial encoding of a magnetic resonance signal of spins of nuclei within the imaging volume, the gradient system comprising a gradient amplifier and a gradient coil, a radio-frequency system comprising a coil array with a plurality of coil elements configured for acquiring magnetic resonance data using parallel imaging, a non-transitory computer readable memory storing machine executable instructions and pulse sequence commands, wherein the pulse sequence commands are configured for controlling the magnetic resonance imaging system to acquire the magnetic resonance data according to a parallel imaging protocol, a processor for controlling the magnetic resonance imaging system, wherein the method comprises:

acquiring by the coil elements first magnetic resonance data simultaneously from a plurality of passive local probes using a first set of the pulse sequence commands, wherein the local probes are located spaced apart from each other;

disentangling contributions to the first magnetic resonance data from the individual local probes using the parallel imaging protocol, calculating for the magnetic resonance imaging system a gradient impulse response function of the gradient system using the first magnetic resonance data from the local probes;

determining a correction for compensating a deviation of the behavior of the gradient system from a predefined behavior using the gradient impulse response function;

applying the correction for generating magnetic resonance images of a subject, wherein generating the magnetic resonance images comprises acquiring second magnetic resonance data from the subject with a second set of the pulse sequence commands by the coil elements and reconstructing the magnetic resonance images of the subject using the second magnetic resonance data.

* * * * *